United States Patent
Ikeda

(10) Patent No.: US 9,520,716 B2
(45) Date of Patent: Dec. 13, 2016

(54) ELECTROSTATIC PROTECTION CIRCUIT AND SEMICONDUCTOR INTEGRATED CIRCUIT APPARATUS

(71) Applicant: SEIKO EPSON CORPORATION, Tokyo (JP)

(72) Inventor: Masuhide Ikeda, Matsumoto (JP)

(73) Assignee: SEIKO EPSON CORPORATION, Tokyo (JP)

( * ) Notice: Subject to any disclaimer, the term of this patent is extended or adjusted under 35 U.S.C. 154(b) by 243 days.

(21) Appl. No.: 14/561,717

(22) Filed: Dec. 5, 2014

(65) Prior Publication Data

US 2015/0162745 A1   Jun. 11, 2015

(30) Foreign Application Priority Data

Dec. 9, 2013   (JP) ................................. 2013-253930

(51) Int. Cl.
*H02H 9/04* (2006.01)
*H01L 27/02* (2006.01)

(52) U.S. Cl.
CPC .......... *H02H 9/046* (2013.01); *H01L 27/0248* (2013.01)

(58) Field of Classification Search
None
See application file for complete search history.

(56) References Cited

U.S. PATENT DOCUMENTS

| | | | | |
|---|---|---|---|---|
| 5,946,177 A * | 8/1999 | Miller | ................. | H01L 27/0248 361/56 |
| 7,027,275 B2 * | 4/2006 | Smith | ................. | H01L 27/0251 327/374 |
| 2008/0007882 A1 * | 1/2008 | Bernard | ................. | H02H 9/046 361/56 |
| 2009/0201615 A1 * | 8/2009 | Bernard | ................. | H02H 9/046 361/56 |
| 2010/0296212 A1 * | 11/2010 | Liang | ................. | H01L 27/0285 361/56 |
| 2013/0100561 A1 * | 4/2013 | Senouci | ................. | H02H 9/046 361/56 |
| 2013/0170081 A1 * | 7/2013 | Singh | ..................... | H02H 9/046 361/56 |

(Continued)

FOREIGN PATENT DOCUMENTS

JP   A-2009-182119   8/2009
JP   A-2014-132717   7/2014

*Primary Examiner* — Stephen W Jackson
*Assistant Examiner* — Christopher Clark
(74) *Attorney, Agent, or Firm* — Oliff PLC

(57) ABSTRACT

The following are included: a series circuit that is connected between a first node and a second node and includes an impedance element and a capacitor connected to each other by a third node; a first transistor that is connected between the first node and a fourth node and turns on in accordance with an increase in voltage generated in the impedance element; a voltage divider circuit that divides voltage between the fourth node and the second node; a second transistor that turns on in accordance with an increase in the divided voltage and increases current flowing in the impedance element; a detection circuit that activates an output signal upon detection of an on state of the second transistor; and a discharge circuit that allows current to flow from the first node to the second node when the output signal of the detection circuit is activated.

18 Claims, 7 Drawing Sheets

(56) References Cited

U.S. PATENT DOCUMENTS

| | | | |
|---|---|---|---|
| 2013/0229736 A1* | 9/2013 | Van Der Borght | H02H 9/046 361/56 |
| 2013/0235497 A1* | 9/2013 | Ma | H02H 9/046 361/56 |
| 2014/0192445 A1* | 7/2014 | Ikeda | H02H 9/046 361/56 |
| 2015/0084702 A1* | 3/2015 | Tesch | H02H 9/046 330/298 |
| 2016/0087429 A1* | 3/2016 | Wang | H02H 9/046 361/56 |
| 2016/0149403 A1* | 5/2016 | Ikeda | H02H 9/04 361/56 |

* cited by examiner

ELECTROSTATIC PROTECTION CIRCUIT AND SEMICONDUCTOR INTEGRATED CIRCUIT APPARATUS

BACKGROUND

1. Technical Field

The present invention relates to an electrostatic protection circuit for protecting a semiconductor integrated circuit apparatus from electrostatic discharge (ESD). The invention further relates to a semiconductor integrated circuit apparatus embedded with such an electrostatic protection circuit.

2. Related Art

A semiconductor integrated circuit apparatus may be provided with an electrostatic protection circuit to prevent destruction of an internal circuit caused by static electricity. In general, an electrostatic protection circuit is connected between a first terminal to which a potential of a high-potential side is supplied and a second terminal to which a potential of a low-potential side is supplied. For example, when a positive electric charge is applied to the first terminal due to electrostatic discharge, the positive electric charge is discharged to the second terminal via the electrostatic protection circuit. In this case, an excessive voltage is not applied to the internal circuit, and hence destruction of the internal circuit can be prevented.

As related technology, JP-A-2009-182119 discloses an electrostatic discharge protection circuit aiming to sufficiently discharge an electric charge attributed to electrostatic discharge and to remove noise during a normal operation. This electrostatic discharge protection circuit includes a first power supply line, a second power supply line, a time constant circuit, an inverter, and a second N-channel transistor. When connected to a direct-current power supply, the first power supply line has a first potential and the second power supply line has a second potential that is lower than the first potential. The time constant circuit is composed of a capacitor and a first N-channel transistor that are connected in series between the first power supply line and the second power supply line, the first N-channel transistor having a negative threshold voltage. An input side of the inverter is connected to a connection node between the capacitor and the first N-channel transistor, and an output side thereof is connected to a gate of the first N-channel transistor. The second N-channel transistor is connected between the first power supply line and the second power supply line, and a gate thereof is indirectly connected to the connection node between the capacitor and the first N-channel transistor. The second N-channel transistor becomes electrically conductive in response to an increase in a potential of the gate caused by an increase in a potential of that connection node.

When an ESD event occurs in this electrostatic discharge protection circuit, the potential of the connection node between the capacitor and the first N-channel transistor increases rapidly, and a low-level signal is output from the inverter. This low-level signal is input to the gate of the first N-channel transistor. Therefore, the value of on-resistance of the first N-channel transistor is large, and the first N-channel transistor hence serves as a high resistor that, together with the capacitor, composes a CR time constant circuit. Also, this low-level signal is indirectly input to the gate of the second N-channel transistor. As a result, the second N-channel transistor is placed in an on state, thereby allowing a surge current attributed to the ESD event to escape.

As described above, according to the invention of JP-A-2009-182119, the second N-channel transistor is placed in the on state only for a time period corresponding to the value of a time constant CR determined by a product of the capacitance value of the capacitor and the value of on-resistance of the first N-channel transistor (e.g., a value on the order of several MΩ, due to the input of the low-level signal), and the surge current attributed to the ESD event is discharged during that time period.

JP-A-2009-182119 (paragraphs 0014 to 0016, FIG. 1) is an example of related art.

However, in the electrostatic discharge protection circuit shown in FIG. 1 of JP-A-2009-182119, whether or not to start a protection operation is not determined based on a magnitude of voltage applied to a time constant circuit 11, but is determined based solely on the steepness of a rise in the voltage applied to the time constant circuit 11. Therefore, if the time constant is set so as to achieve sufficient protection characteristics against electrostatic discharge, the protection operation could possibly be started in response to a steep rise in a power supply voltage even during a normal operation.

Also, the on period of an N-channel transistor 14 connected between power supply lines is determined based on a time constant of the time constant circuit 11. Therefore, for example, when a plurality of ESD events occur successively in a short amount of time, an electric charge is further accumulated in a semiconductor integrated circuit apparatus due to reoccurrence of electrostatic discharge while a capacitor 11a of the time constant circuit 11 is charged. As a result, the N-channel transistor 14 is placed in an off state without sufficient discharge of the accumulated electric charge, which may result in destruction of an internal circuit.

Furthermore, while an N-channel transistor 11b having a negative threshold voltage is used in the time constant circuit 11, formation of such a special transistor complicates processes for manufacturing the semiconductor integrated circuit apparatus. This makes a cost increase unavoidable.

SUMMARY

An advantage of some aspects of the invention is to provide an electrostatic protection circuit that can achieve sufficient protection characteristics against electrostatic discharge using a simple circuit configuration without malfunction during a normal operation.

According to a first aspect of the invention, an electrostatic protection circuit in a semiconductor integrated circuit apparatus is connected via a first node to a first terminal to which a potential of a high-potential side is supplied, and is connected via a second node to a second terminal to which a potential of a low-potential side is supplied. The electrostatic protection circuit includes: a series circuit that is connected between a first node and a second node and includes a first impedance element and a capacitor connected to each other by a third node; a first transistor that is connected between one of the first and second nodes and a fourth node and turns on in accordance with an increase in voltage generated in the first impedance element; a voltage divider circuit that includes at least one impedance element connected between the fourth node and a fifth node and a third impedance element connected between the fifth node and the other of the first and second nodes, and that divides voltage between the fourth node and the other of the first and second nodes, the at least one impedance element including a second impedance element; a second transistor that turns on in accordance with an increase in the voltage divided by the voltage divider circuit and increases current flowing in the first impedance element; a detection circuit that activates an output signal upon detection of an on state of the second transistor; and a discharge circuit that allows current to flow from the first node to the second node when the output signal of the detection circuit is activated.

According to the first aspect of the invention, when the first and second transistors make a transition from an off state to an on state, a condition for transition is determined by a time constant of the first impedance element and the capacitor and by voltage between the first node and the second node. Meanwhile, once the first and second transistors are placed in the on state, the on state of the first and second transistors is kept while voltage between the first node and the second node is high, regardless of the time constant of the first impedance element and the capacitor.

Therefore, even if a power supply voltage rises steeply due to input of power supply during a normal operation, there is no possibility that the electrostatic protection circuit starts a protection operation as long as voltage between the first node and the second node is lower than a predetermined value. Also, once the electrostatic protection circuit starts the protection operation due to electrostatic discharge, the electrostatic protection circuit does not stop the protection operation as long as voltage between the first node and the second node is equal to or higher than the predetermined value. As described above, one aspect of the invention can provide the electrostatic protection circuit that can achieve sufficient protection characteristics against electrostatic discharge using a simple circuit configuration without malfunction during a normal operation.

In the electrostatic protection circuit according to a second aspect of the invention, the voltage divider circuit further includes a third transistor that is connected in parallel to the second impedance element and that turns on when the output signal of the detection circuit is activated. According to the second aspect of the invention, once the electrostatic protection circuit starts the protection operation due to electrostatic discharge, a division ratio of the voltage divider circuit increases. As a result, voltage between the first node and the second node decreases, a margin for voltage that brings an internal circuit of the semiconductor integrated circuit apparatus to destruction increases, and an amount of tolerance for static electricity increases.

In the electrostatic protection circuit according to a third aspect of the invention, the voltage divider circuit includes a plurality of impedance elements and at least one transistor, the plurality of impedance elements being connected in series between the fourth node and the fifth node, and the at least one transistor being connected in parallel to at least one of the plurality of impedance elements and turning on when the output signal of the detection circuit is activated. The third aspect of the invention not only achieves the effects achieved by the second aspect of the invention, but also enables settings of current-voltage characteristics of the electrostatic protection circuit precisely and freely.

It is preferable that the second impedance element or each of the plurality of impedance elements includes at least one of a resistor element, a diode, and a P-channel transistor or an N-channel transistor in which a gate is connected to a drain or a source. An appropriate device is selected or a plurality of devices are combined from among the above-referenced devices. This makes it possible to freely set an end-to-end voltage of the electrostatic protection circuit, and to provide the electrostatic protection circuit that is not easily influenced by process variation.

It is preferable that the first impedance element includes one of: a resistor element connected between the first node and the third node; and a P-channel transistor having a source, a drain, and a gate connected to the first node, the third node, and the second node, respectively, and the third impedance element includes one of: a resistor element connected between the fifth node and the second node; and an N-channel transistor having a drain, a source, and a gate connected to the fifth node, the second node, and the first node, respectively.

When a resistor element is used as the first or third impedance element, since the resistance value of the resistor element is constant, it is easy to set the time constant of the first impedance element and the capacitor, and to set an on-condition for the second transistor. On the other hand, when a transistor is used as the first or third impedance element, on-resistance of the transistor increases as voltage between the first node and the second node decreases, thereby preventing the first or second transistor from turning off in the middle of the protection operation.

In this case, it is preferable that the first transistor includes a P-channel transistor having a source, a drain, and a gate connected to the first node, the fourth node, and the third node, respectively, and voltage is applied to the voltage divider circuit by the P-channel transistor turning on in accordance with an increase in voltage between the first node and the third node. In this way, when voltage between the first node and the third node becomes equal to or higher than a threshold voltage of the P-channel transistor due to application of a steep positive voltage between the first node and the second node, the P-channel transistor turns on, and voltage between the first node and the second node is applied to the voltage divider circuit.

It is preferable that the second transistor includes an N-channel transistor having a drain, a source, and a gate connected to the third node, the second node, and the fifth node, respectively, and the output signal of the detection circuit is activated by the N-channel transistor turning on in accordance with an increase in voltage between the fifth node and the second node. In this way, when the voltage divided by the voltage divider circuit becomes equal to or higher than a threshold voltage of the N-channel transistor, the N-channel transistor turns on, and the output signal of the detection circuit is activated. Therefore, the electrostatic protection circuit starts the protection operation.

It is preferable that the detection circuit includes an inverter having an input terminal to which a potential of the third node is supplied, and activates the output signal when voltage generated in the first impedance element becomes higher than a predetermined percentage of voltage between the first node and the second node. With the use of the inverter in the detection circuit, it is possible to detect whether the potential of the third node is of a high level or a low level using a simple circuit configuration.

It is preferable that the discharge circuit includes one of: an N-channel transistor having a drain connected to the first node, a source connected to the second node, and a gate to which the output signal of the detection circuit is supplied; and an NPN transistor having a collector connected to the first node, an emitter connected to the second node, and a base to which the output signal of the detection circuit is supplied. The N-channel transistor or the NPN transistor can be formed on a P-type semiconductor substrate without an intervening well, and has excellent characteristics.

Furthermore, according to another aspect of the invention, a semiconductor integrated circuit apparatus includes the electrostatic protection circuit according to any one of the aspects of the invention. In this way, destruction of an internal circuit caused by electrostatic discharge can be prevented in various types of semiconductor integrated circuit apparatuses.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
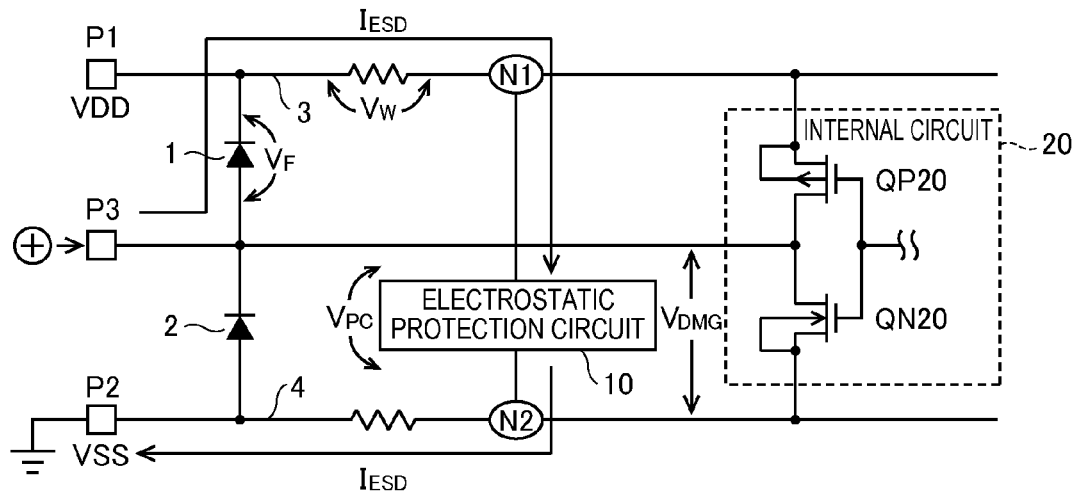
FIG. 1 is a circuit diagram showing an example of a configuration of a semiconductor integrated circuit apparatus embedded with an electrostatic protection circuit.

The following describes embodiments of the invention in detail with reference to the accompanying drawings. The same constituent elements are given the same reference numeral, and redundant descriptions will be omitted.

An electrostatic protection circuit according to the embodiments of the invention is connected between a first terminal to which a potential of a high-potential side is supplied and a second terminal to which a potential of a low-potential side is supplied in a semiconductor integrated circuit apparatus. Here, the first terminal may be a power supply terminal to which a power supply potential of a high-potential side is supplied, and the second terminal may be a power supply terminal to which a power supply potential of a low-potential side is supplied. Also, the first terminal may be a power supply terminal to which a power supply potential of a high-potential side is supplied, and the second terminal may be a signal terminal to which a signal potential is supplied. Alternatively, the first terminal may be a signal terminal to which a signal potential is supplied, and the second terminal may be a power supply terminal to which a power supply potential of a low-potential side is supplied.

Figure 2:
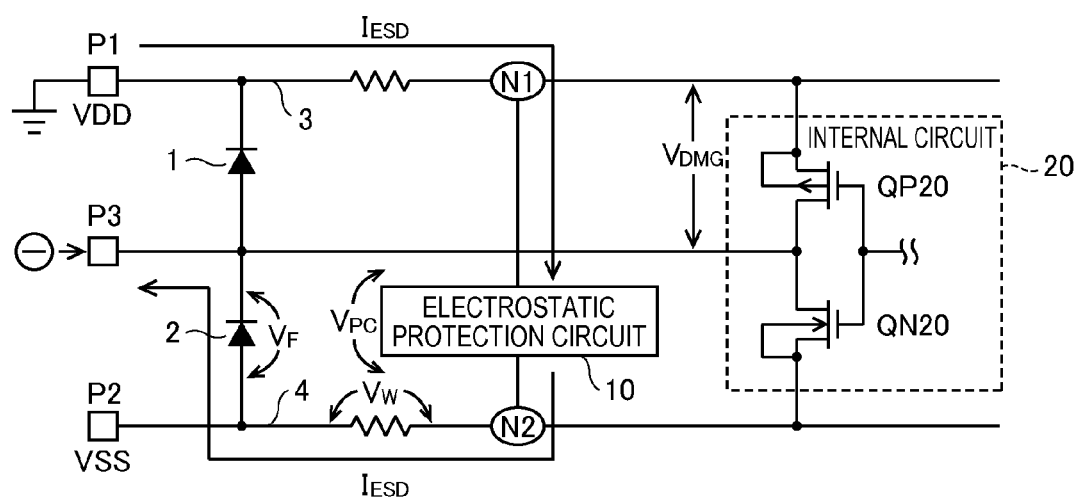
FIG. 2 is a circuit diagram showing an example of a configuration of a semiconductor integrated circuit apparatus embedded with an electrostatic protection circuit.

FIGS. 1 and 2 are circuit diagrams showing examples of a configuration of a semiconductor integrated circuit apparatus embedded with an electrostatic protection circuit according to the embodiments of the invention. This semiconductor integrated circuit apparatus includes power supply terminals P1 and P2, a signal terminal P3, diodes 1 and 2, power supply interconnects 3 and 4, an electrostatic protection circuit 10, and an internal circuit 20. The power supply interconnects 3 and 4 each have a resistance component. The internal circuit 20 includes a P-channel MOS transistor QP20 and an N-channel MOS transistor QN20.

FIGS. 1 and 2 show an exemplary case in which the electrostatic protection circuit 10 is connected via a node N1 to the power supply terminal P1 to which a power supply potential VDD of a high-potential side is supplied, and is connected via a node N2 to the power supply terminal P2 to which a power supply potential VSS of a low-potential side is supplied. A description is now given of this case.

For example, when a positive electric charge is applied to the power supply terminal P2 due to electrostatic discharge, the positive electric charge is discharged to the signal terminal P3 via the diode 2, or is discharged to the power supply terminal P1 via the diodes 2 and 1. In this case, an excessive voltage is not applied to the internal circuit 20, and hence destruction of the internal circuit 20 can be prevented. Therefore, the problem arises when a reverse voltage is applied to at least one of the diodes 1 and 2.

FIG. 1 shows a discharge path for a case in which a positive electric charge is applied to the signal terminal P3 due to electrostatic discharge and the power supply terminal P2 is grounded. Due to electrostatic discharge, a surge current $I_{ESD}$ flows in a path through the diode 1, the power supply interconnect 3, the electrostatic protection circuit 10, and the power supply interconnect 4.

During a discharge operation, the electrostatic protection circuit 10 can protect the internal circuit 20 when a drain-source voltage of the transistor QN 20, which is connected in parallel to the diode 2 to which the reverse voltage is applied, is lower than voltage $V_{DMG}$ that brings the transistor QN20 to destruction. To this end, the following expression (1) needs to be satisfied.

$$V_F + V_W + V_{PC} < V_{DMG} \qquad (1)$$

Here, $V_F$ is a forward voltage of the diode 1, $V_W$ is voltage generated when the surge current $I_{ESD}$ has flowed in the resistance component of the power supply interconnect 3, and $V_{PC}$ is voltage generated when the surge current $I_{ESD}$ has flowed in the electrostatic protection circuit 10.

On the other hand, FIG. 2 shows a discharge path for a case in which a negative electric charge is applied to the signal terminal P3 due to electrostatic discharge and the power supply terminal P1 is grounded. Due to electrostatic discharge, the surge current $I_{ESD}$ flows in a path through the power supply interconnect 3, the electrostatic protection circuit 10, the power supply interconnect 4, and the diode 2.

During a discharge operation, the electrostatic protection circuit 10 can protect the internal circuit 20 when a source-drain voltage of the transistor QP 20, which is connected in parallel to the diode 1 to which the reverse voltage is applied, is lower than voltage $V_{DMG}$ that brings the transistor QP20 to destruction. To this end, the following expression (2) needs to be satisfied.

$$V_F + V_W + V_{PC} < V_{DMG} \qquad (2)$$

Here, $V_F$ is a forward voltage of the diode 2, $V_W$ is voltage generated when the surge current $I_{ESD}$ has flowed in the resistance component of the power supply interconnect 4, and $V_{PC}$ is voltage generated when the surge current $I_{ESD}$ has flowed in the electrostatic protection circuit 10.

As can be seen from expressions (1) and (2), in the case of FIG. 1 and the case of FIG. 2, a condition for protecting the internal circuit 20 can be expressed by the same expression. That is to say, the internal circuit 20 is protected on the condition that a total voltage generated in devices on a discharge path is lower than voltage $V_{DMG}$ that brings elements of the internal circuit 20 to destruction.

First Embodiment

Figure 3:
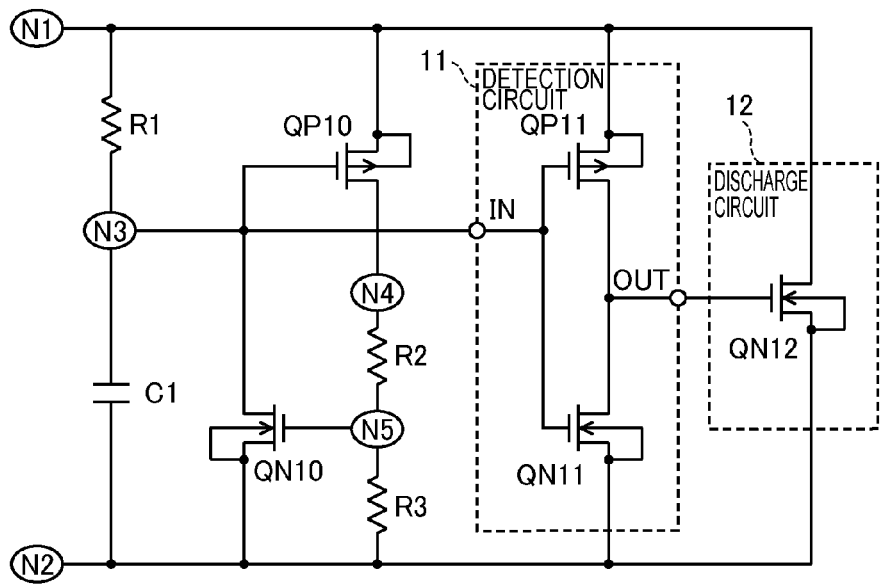
FIG. 3 is a circuit diagram showing an example of a configuration of an electrostatic protection circuit according to a first embodiment of the invention.

FIG. 3 is a circuit diagram showing an example of a configuration of an electrostatic protection circuit according to a first embodiment of the invention. As shown in FIG. 3, an electrostatic protection circuit 10 includes resistor elements R1 to R3 as first to third impedance elements, a capacitor C1, a P-channel MOS transistor QP10 as a first transistor, an N-channel MOS transistor QN10 as a second transistor, a detection circuit 11, and a discharge circuit 12.

The electrostatic protection circuit 10 is connected via a node N1 to a first terminal to which a potential of a high-potential side is supplied, and is connected via a node N2 to a second terminal to which a potential of a low-potential side is supplied. A series circuit including the resistor element R1 and the capacitor C1, which are connected to each other by the node N3, is connected between the node N1 and the node N2. In the present embodiment, the resistor element R1 is connected between the node N1 and the node N3, and the capacitor C1 is connected between the node N3 and the node N2.

The capacitor C1 may be configured using a plurality of electrodes formed on a plurality of interconnect layers, and may be configured using at least one MOS transistor. For example, the capacitor C1 can be configured by using a drain, a source, and a back gate of an N-channel MOS transistor as a first electrode, and using a gate thereof as a second electrode.

The transistor QP10 is connected between the node N1 and a node N4, and turns on in accordance with an increase in voltage generated in the resistor element R1. That is to say, the transistor QP10 has a source, a drain, and a gate that are connected to the node N1, the node N4, and the node N3, respectively, and turns on when voltage between the node N1 and the node N3 becomes equal to or higher than a threshold voltage.

The resistor element R2 is connected between the node N4 and a node N5. The resistor element R3 is connected between the node N5 and the node N2. Here, the resistor elements R2 and R3 compose a voltage divider circuit that divides voltage between the node N4 and the node N2.

The transistor QN10 turns on in accordance with an increase in the voltage divided by the voltage divider circuit, and increases current that flows in the resistor element R1. That is to say, the transistor QN10 has a drain, a source, and a gate that are connected to the node N3, the node N2, and the node N5, respectively, and turns on when voltage between the node N5 and the node N2 becomes equal to or higher than a threshold voltage.

The detection circuit 11 activates an output signal upon detection of an on state of the transistor QN10. For example, the detection circuit 11 includes an inverter composed of a P-channel MOS transistor QP11 and an N-channel MOS transistor QN11. The transistor QP11 has a source, a drain, and a gate that are connected to the node N1, an output terminal OUT, and an input terminal IN, respectively. The transistor QN11 has a drain, a source, and a gate that are connected to the output terminal OUT, the node N2, and the input terminal IN, respectively.

The inverter detects whether a potential of the node N3 supplied to the input terminal IN is of a high level or a low level, inverts the level thereof, and outputs an output signal of the inverted level from the output terminal OUT. In this way, the detection circuit 11 activates the output signal to a high level when voltage generated in the resistor element R1 becomes higher than a predetermined percentage (e.g., 50%) of voltage between the node N1 and the node N2. Other than the inverter, a comparator and the like can be used in the detection circuit 11.

The discharge circuit 12 includes, for example, an N-channel MOS transistor QN12. The transistor QN12 has a drain connected to the node N1, a source connected to the node N2, and a gate to which the output signal of the detection circuit 11 is supplied. The discharge circuit 12 allows current to flow from the node N1 to the node N2 when the output signal of the detection circuit 11 is activated to a high level.

A description is now given of an operation of the electrostatic protection circuit 10 shown in FIG. 3.

When a positive voltage is applied between the node N1 and the node N2 (a potential of the node N1>a potential of the node N2), current flows from the node N1 to the node N2 via the resistor element R1 and the capacitor C1 in accordance with a time constant of the resistor element R1 and the capacitor C1, and the capacitor C1 is charged. As a result, a potential of the node N3 increases relative to the potential of the node N2 in accordance with the time constant of the resistor element R1 and the capacitor C1.

When voltage applied between the node N1 and the node N2 increases moderately during a normal operation, voltage between the node N1 and the node N3 remains lower than a threshold voltage of the transistor QP10, and an off state of the transistor QP10 is maintained. On the other hand, when voltage applied between the node N1 and the node N2 increases steeply during a normal operation or due to electrostatic discharge, voltage between the node N1 and the node N3 becomes equal to or higher than the threshold voltage of the transistor QP10, and the transistor QP10 turns on. It should be noted that, at this point, a potential of the input terminal IN of the detection circuit 11 is of a high level.

As the transistor QP10 turns on, voltage is applied to the voltage divider circuit composed of the resistor elements R2 and R3, and voltage between the node N5 and the node N2 increases from 0 V. Here, when voltage between the node N1 and the node N2 is lower than a predetermined value, voltage between the node N5 and the node N2 remains lower than a threshold voltage of the transistor QN10, and an off state of the transistor QN10 is maintained. On the other hand, when voltage between the node N1 and the node N2 is equal to or higher than the predetermined value, voltage between the node N5 and the node N2 is equal to or higher than the threshold voltage of the transistor QN10, and the transistor QN10 turns on.

As the transistor QN10 turns on, current flowing in the resistor element R1 increases, and voltage between the node N1 and the node N3 increases. As a result, current flowing in the transistor QP10 increases (positive feedback). At the same time, a potential of the input terminal IN of the detection circuit 11 turns into a low level, and the output signal of the detection circuit 11 is activated to a high level.

Consequently, the transistor QN12 of the discharge circuit 12 starts to allow current to flow from the node N1 to the node N2.

Also, due to an increase in current flowing in the transistor QP10, current flowing in the resistor elements R2 and R3 increases. As a result, voltage between the node N5 and the node N2 increases, and therefore current flowing in the transistor QN10 increases (positive feedback). At the same time, current flowing in the transistor QN12 of the discharge circuit 12 increases as well.

An increase in the current flowing in the transistor QN12 of the discharge circuit 12 makes voltage between the node N1 and the node N2 lower than the predetermined value. Consequently, voltage between the node N5 and the node N2 becomes lower than the threshold voltage of the transistor QN10, and therefore the transistor QN10 makes a transition from the on state to the off state. As a result, current flowing in the resistor element R1 decreases. Therefore, the output signal of the detection circuit 11 is deactivated to a low level, the transistor QN12 of the discharge circuit 12 makes a transition from the on state to the off state, and voltage between the node N1 and the node N2 is held substantially constant.

As described above, when the transistors QP10 and QN10 make a transition from the off state to the on state, a condition for transition is determined by the time constant of the resistor element R1 and the capacitor C1 and by voltage between the node N1 and the node N2. Meanwhile, once the transistors QP10 and QN10 are placed in the on state, the on state of the transistors QP10 and QN10 is kept while voltage between the node N1 and the node N2 is high, regardless of the time constant of the resistor element R1 and the capacitor C1.

Therefore, even if a power supply voltage rises steeply due to input of power supply during normal use, there is no possibility that the electrostatic protection circuit 10 starts a protection operation as long as voltage between the node N1 and the node N2 is lower than the predetermined value. Also, once the electrostatic protection circuit 10 starts the protection operation due to electrostatic discharge, the electrostatic protection circuit 10 does not stop the protection operation as long as voltage between the node N1 and the node N2 is equal to or higher than the predetermined value. As described above, the present embodiment can provide the electrostatic protection circuit 10 that can achieve sufficient protection characteristics against electrostatic discharge using a simple circuit configuration without malfunction during a normal operation.

Due to the above-referenced operation mechanism, current flows in the discharge path with an end-to-end voltage of the electrostatic protection circuit 10 being held at the predetermined value. Hereinafter, voltage held between both ends of the electrostatic protection circuit 10 is also referred to as a "held voltage". In the present embodiment, the held voltage has a substantially constant value.

The held voltage $V_H$ is voltage between the node N1 and the node N2 when the transistor QN10 makes a transition from the on state to the off state, and can be approximated by the following expression (3).

$$V_H \approx Vth_{QN10} \times (R_2+R_3)/R_3 \quad (3)$$

Here, $Vth_{QN10}$ is the threshold voltage of the transistor QN10, $R_2$ is a resistance value of the resistor element R2, and $R_3$ is a resistance value of the resistor element R3. It is assumed that the resistance values $R_2$ and $R_3$ are sufficiently large compared to on-resistance of the transistor QP10. A desired held voltage $V_H$ can be set by selecting the resistance values of the resistor elements R2 and R3 in accordance with expression (3).

When a resistor element is used as the first or third impedance element, since the resistance value of the resistor element is constant, it is easy to set the time constant of the resistor element R1 and the capacitor C1, and to set an on-condition for the transistor QN10. A device other than a resistor element can be used as an impedance element. A detailed description thereof will be provided later.

Figure 4:
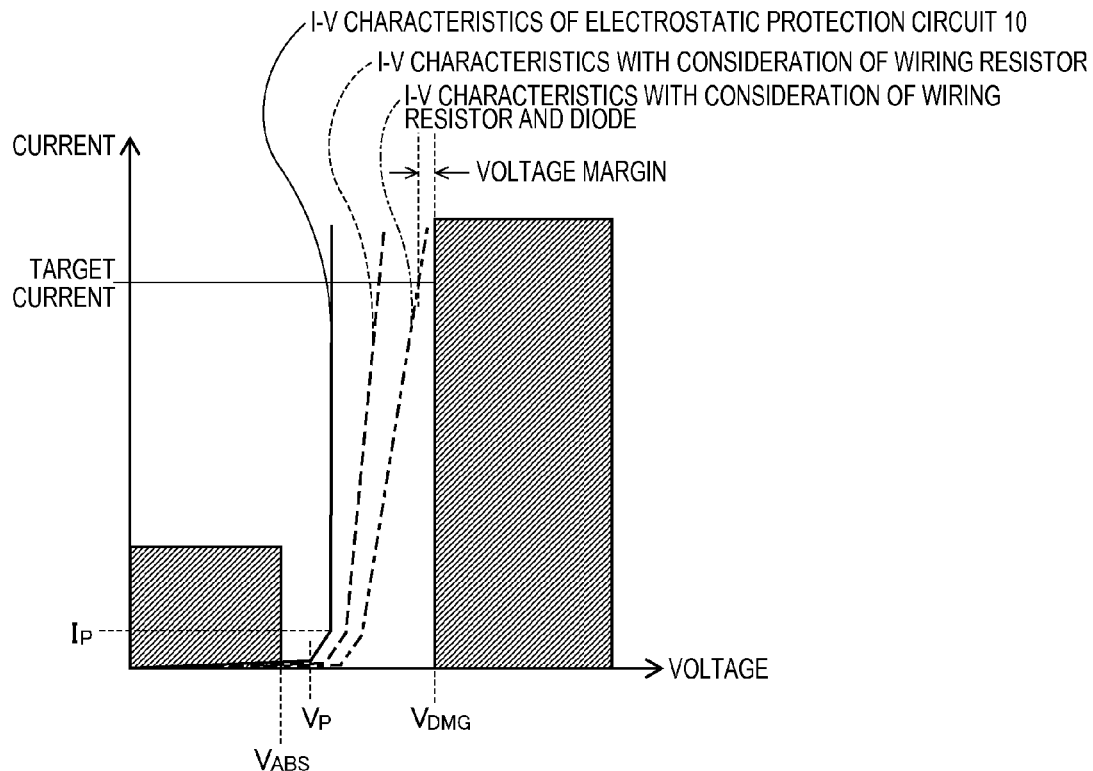
FIG. 4 shows I-V characteristics for a case in which the electrostatic protection circuit shown in FIG. 3 is applied.
Figure 5:
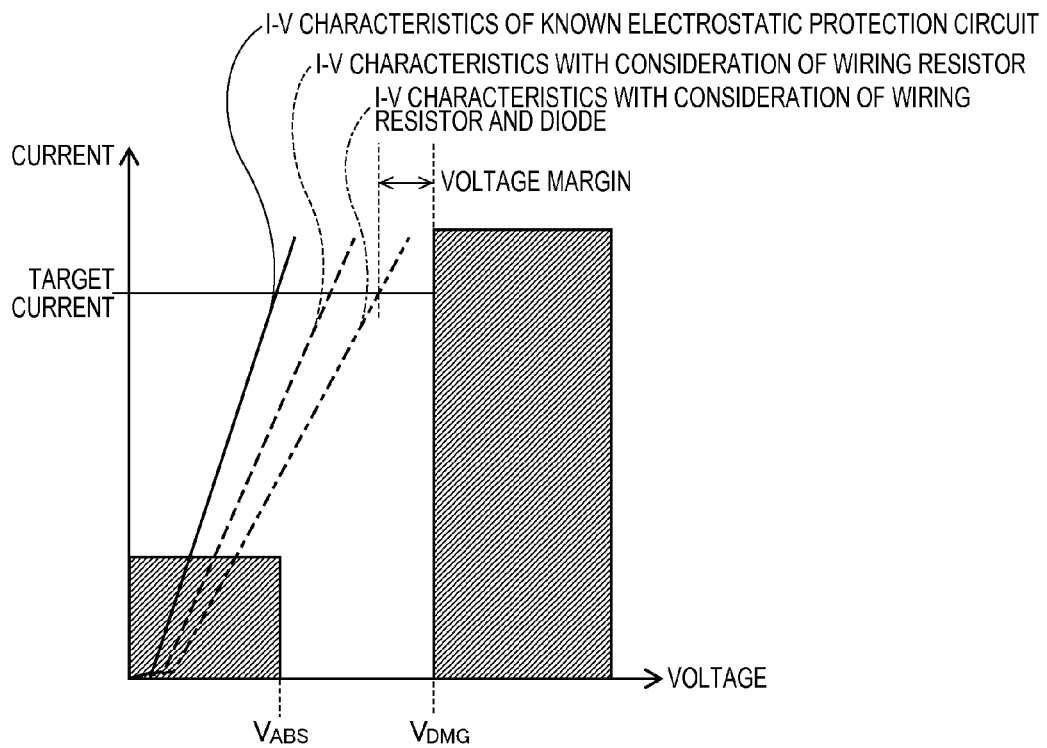
FIG. 5 shows I-V characteristics for a case in which a known electrostatic protection circuit is applied.

FIG. 4 shows I-V characteristics for a case in which the electrostatic protection circuit shown in FIG. 3 is applied to the semiconductor integrated circuit apparatus shown in FIG. 1. FIG. 5 shows I-V characteristics for a case in which a known electrostatic protection circuit is applied to the semiconductor integrated circuit apparatus shown in FIG. 1. In FIGS. 4 and 5, a horizontal axis represents an end-to-end voltage of the electrostatic protection circuit and the like in a discharge path, and a vertical axis represents current flowing in the discharge path.

As shown in FIG. 4, in the electrostatic protection circuit 10 according to the first embodiment of the invention, a protection operation is not started in a region where the end-to-end voltage is equal to or lower than an absolute maximum rated voltage $V_{ABS}$, and therefore current does not flow in the discharge path therein. On the other hand, when the end-to-end voltage exceeds a predetermined voltage $V_P$, the electrostatic protection circuit 10 starts the protection operation, and current starts to flow in the discharge path. When the current flowing in the discharge path exceeds a predetermined current $I_P$, the electrostatic protection circuit 10 keeps the end-to-end voltage at a substantially constant value. Even in consideration of voltage generated in a interconnect resistor and a diode, when the current flowing in the discharge path reaches a target current, a voltage margin exists between a terminal-to-terminal voltage of the semiconductor integrated circuit apparatus and the voltage $V_{DMG}$ that brings the elements of the internal circuit 20 to destruction.

In contrast, the known electrostatic protection circuit shown in FIG. 1 of JP-A-2009-182119 is not provided with a voltage divider circuit composed of a plurality of resistor elements. In this case, as shown in FIG. 5, the electrostatic protection circuit starts the protection operation in a region where an end-to-end voltage of the electrostatic protection circuit is lower than the absolute maximum rated voltage $V_{ABS}$, and current has started to flow in the discharge path therein. Consequently, even during a normal operation, the electrostatic protection circuit starts the protection operation in response to a steep rise in a power supply voltage caused by input of power supply, thereby allowing current to flow. This gives rise to the possibility of malfunction of the semiconductor integrated circuit apparatus. For this reason, when the known electrostatic protection circuit is used, it is necessary to place restrictions on rising characteristics of the power supply voltage at the time of input of power supply.

Second Embodiment

Figure 6:
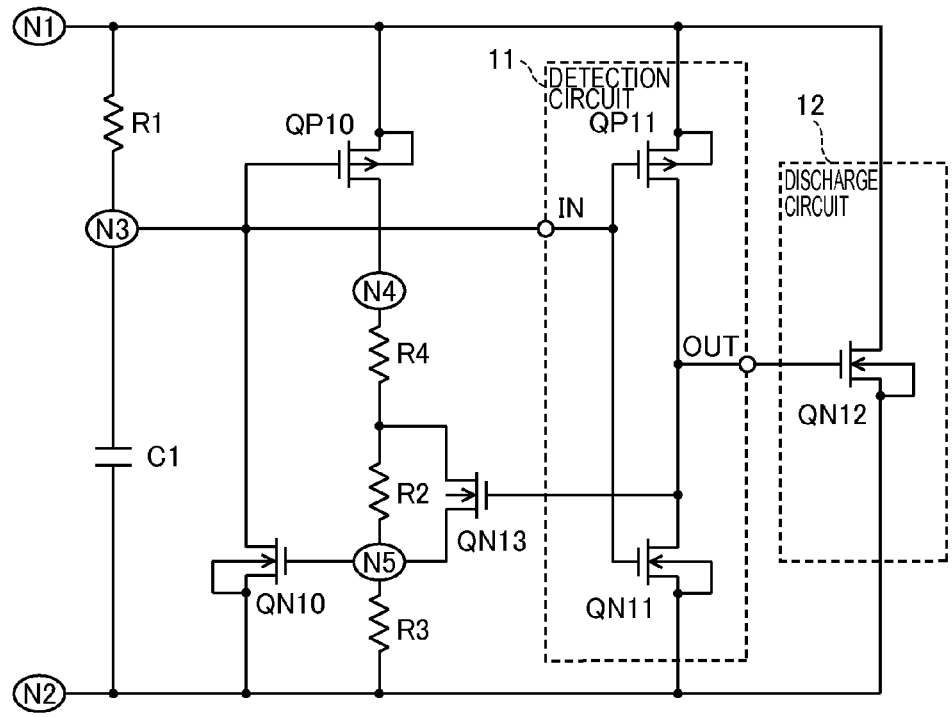
FIG. 6 is a circuit diagram showing an example of a configuration of an electrostatic protection circuit according to a second embodiment of the invention.

FIG. 6 is a circuit diagram showing an example of a configuration of an electrostatic protection circuit according to a second embodiment of the invention. As compared to the electrostatic protection circuit 10 according to the first embodiment shown in FIG. 3, an electrostatic protection circuit 10a according to the second embodiment additionally includes an N-channel MOS transistor QN13 as a third transistor connected in parallel to a resistor element R2, and may further include a resistor element R4. In other regards, the electrostatic protection circuit 10a shown in FIG. 6 is similar to the electrostatic protection circuit 10 shown in FIG. 3.

The transistor QN13 has a drain, a source, and a gate that are connected to one end of the resistor element R2, the other end of the resistor element R2, and an output terminal OUT of a detection circuit 11, respectively, and turns on when an output signal of the detection circuit 11 is activated to a high level. The resistor element R4 is connected, between a node N4 and a node N5, in series to the resistor element R2.

The transistor QN13, together with resistor elements R2 to R4, composes a voltage divider circuit. Due to electrostatic discharge, the output signal of the detection circuit 11 is activated to a high level, and the electrostatic protection circuit 10a starts a protection operation. Then, the transistor QN13 turns on, and a division ratio of the voltage divider circuit increases. As a result, voltage between a node N1 and a node N2 decreases, a margin for voltage that brings an internal circuit of a semiconductor integrated circuit apparatus to destruction increases, and an amount of tolerance for static electricity increases.

A held voltage $V_H$ is voltage between the node N1 and the node N2 when a transistor QN10 makes a transition from an on state to an off state, and can be approximated by the following expression (4).

$$V_H \approx Vth_{QN10} \times (\alpha R_2 + R_3 + R_4)/R_3 \quad (4)$$

Here, $Vth_{QN10}$ is a threshold voltage of the transistor QN10, α is a coefficient in a range of 0 to 1, $R_2$ is a resistance value of the resistor element R2, $R_3$ is a resistance value of the resistor element R3, and $R_4$ is a resistance value of the resistor element R4. It is assumed that the resistance values $R_2$ and $R_3$ are sufficiently large compared to on-resistance of a transistor QP10. When the resistor element R4 is not provided, $R_4$ is zero.

The larger the current flowing in a transistor QN12 of a discharge circuit 12, the smaller the on-resistance of the transistor QN13, and therefore the smaller the value of the coefficient α. Therefore, in expression (4), the larger the current flowing in the transistor QN12 of the discharge circuit 12, the lower the held voltage $V_H$.

That is to say, when the current flowing in the transistor QN12 of the discharge circuit 12 is small, the held voltage $V_H$ is approximated by the following expression (5) with α being one.

$$V_H \approx Vth_{QN10} \times (R_2 + R_3 + R_4)/R_3 \quad (5)$$

On the other hand, when the current flowing in the transistor QN12 of the discharge circuit 12 is large, the held voltage $V_H$ is approximated by the following expression (6) with α being zero.

$$V_H \times Vth_{QN10} \times (R_3 + R_4)/R_3 \quad (6)$$

The held voltage $V_H$ can be changed in a desired voltage range by setting the resistance values of the resistor elements R2 to R4 in accordance with expressions (5) and (6).

Figure 7:
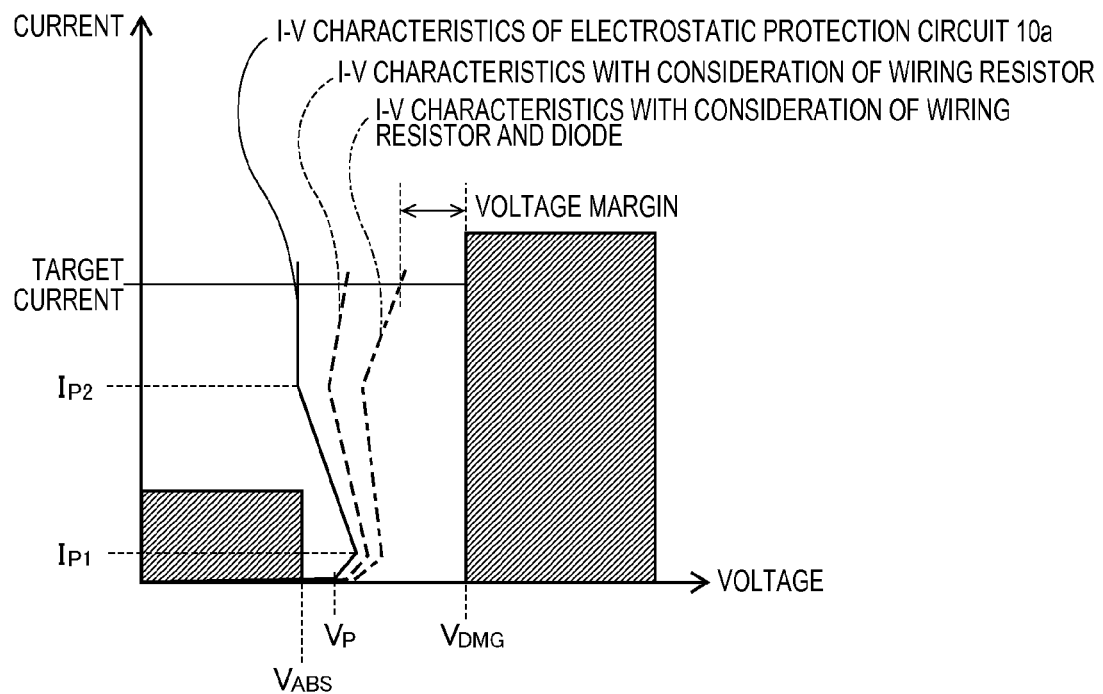
FIG. 7 shows I-V characteristics for a case in which the electrostatic protection circuit shown in FIG. 6 is applied.

FIG. 7 shows I-V characteristics for a case in which the electrostatic protection circuit shown in FIG. 6 is applied to the semiconductor integrated circuit apparatus shown in FIG. 1. In FIG. 7, a horizontal axis represents an end-to-end voltage of the electrostatic protection circuit and the like in a discharge path, and a vertical axis represents current flowing in the discharge path.

As shown in FIG. 7, in the electrostatic protection circuit 10a according to the second embodiment of the invention, a protection operation is not started in a region where the end-to-end voltage is equal to or lower than an absolute maximum rated voltage $V_{ABS}$, and therefore current does not flow in the discharge path therein. On the other hand, when a terminal-to-terminal voltage exceeds a predetermined voltage $V_{P1}$, the electrostatic protection circuit 10a starts the protection operation, and current starts to flow in the discharge path.

In a first operation region where current flowing in the discharge path is from a first predetermined current $I_{P1}$ to a second predetermined current $I_{P2}$, the larger the current flowing in the discharge path, the lower the end-to-end voltage of the electrostatic protection circuit 10a. In a second operation region where current flowing in the discharge path exceeds the second predetermined current $I_{P2}$, the electrostatic protection circuit 10a keeps the end-to-end voltage substantially constant.

In this way, even in consideration of voltage generated in a interconnect resistor and a diode, when current flowing in the discharge path reaches a target current, a voltage margin larger than that of the first embodiment exists between a terminal-to-terminal voltage of the semiconductor integrated circuit apparatus and the voltage $V_{DMG}$ that brings elements of an internal circuit 20 to destruction.

Third Embodiment

Figure 8:
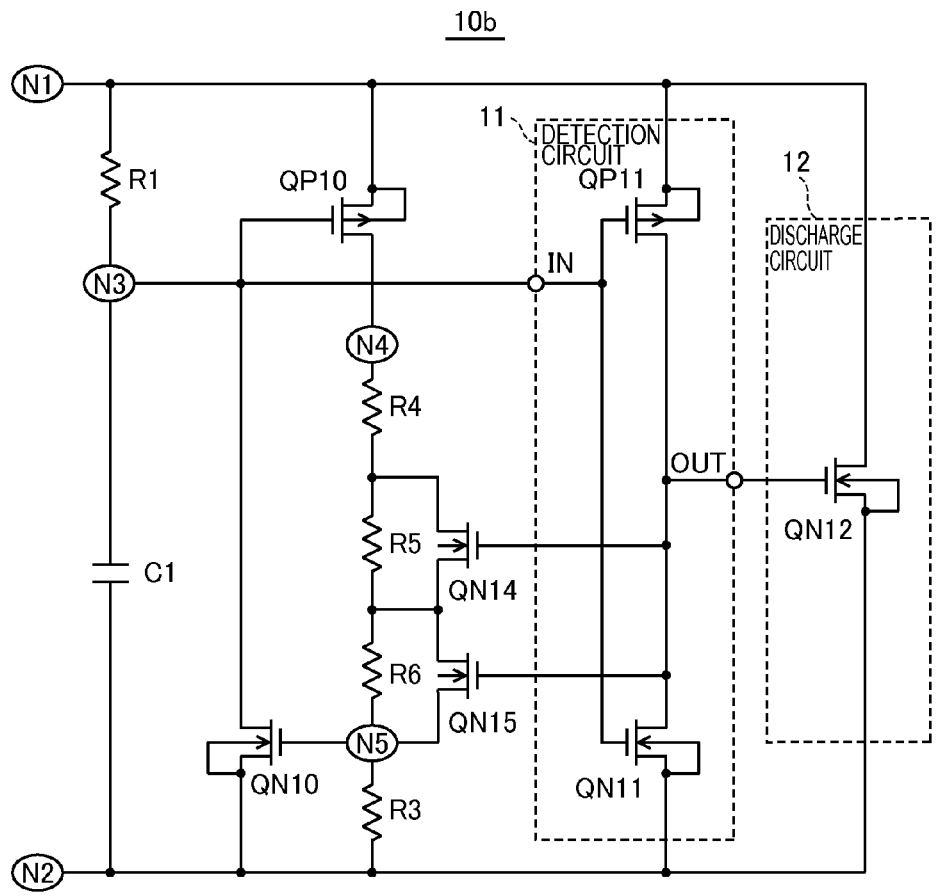
FIG. 8 is a circuit diagram showing an example of a configuration of an electrostatic protection circuit according to a third embodiment of the invention.

FIG. 8 is a circuit diagram showing an example of a configuration of an electrostatic protection circuit according to a third embodiment of the invention. An electrostatic protection circuit 10b according to the third embodiment is realized by connecting a plurality of resistor elements in series between a node N4 and a node N5 in the electrostatic protection circuit 10 according to the first embodiment shown in FIG. 3, and by adding at least one N-channel transistor that is connected in parallel with at least one of these resistor elements. In other regards, the electrostatic protection circuit 10b shown in FIG. 8 is similar to the electrostatic protection circuit 10 shown in FIG. 3.

FIG. 8 exemplarily shows resistor elements R4 to R6 that are connected in series between the node N4 and the node N5, and N-channel MOS transistors QN14 and QN15 that are connected in parallel to the resistor elements R5 and R6, respectively. In this way, a plurality of transistors may be provided that are respectively connected in parallel to a plurality of resistor elements composing a voltage divider circuit.

The transistor QN14 has a drain, a source, and a gate that are connected to one end of the resistor element R5, the other end of the resistor element R5, and an output terminal OUT of a detection circuit 11, respectively, and turns on when an output signal of the detection circuit 11 is activated to a high level. The transistor QN15 has a drain, a source, and a gate that are connected to one end of the resistor element R6, the other end of the resistor element R6, and the output terminal OUT of the detection circuit 11, respectively, and turns on when the output signal of the detection circuit 11 is activated to a high level.

The transistors QN14 and QN15, together with resistor elements R3 to R6, compose a voltage divider circuit. Due to electrostatic discharge, the output signal of the detection circuit 11 is activated to a high level, and the electrostatic protection circuit 10b starts a protection operation. Then, the transistors QN14 and QN15 turn on, and a division ratio of the voltage divider circuit increases. As a result, voltage between a node N1 and a node N2 decreases, a margin for voltage that brings an internal circuit of a semiconductor integrated circuit apparatus to destruction increases, and an amount of tolerance for static electricity increases. Therefore, the electrostatic protection circuit 10b according to the third embodiment, which has I-V characteristics similar to I-V characteristics of the electrostatic protection circuit 10a according to the second embodiment, enables settings of the I-V characteristics in a more precise and freer manner than in the second embodiment.

Fourth Embodiment

Figure 9:
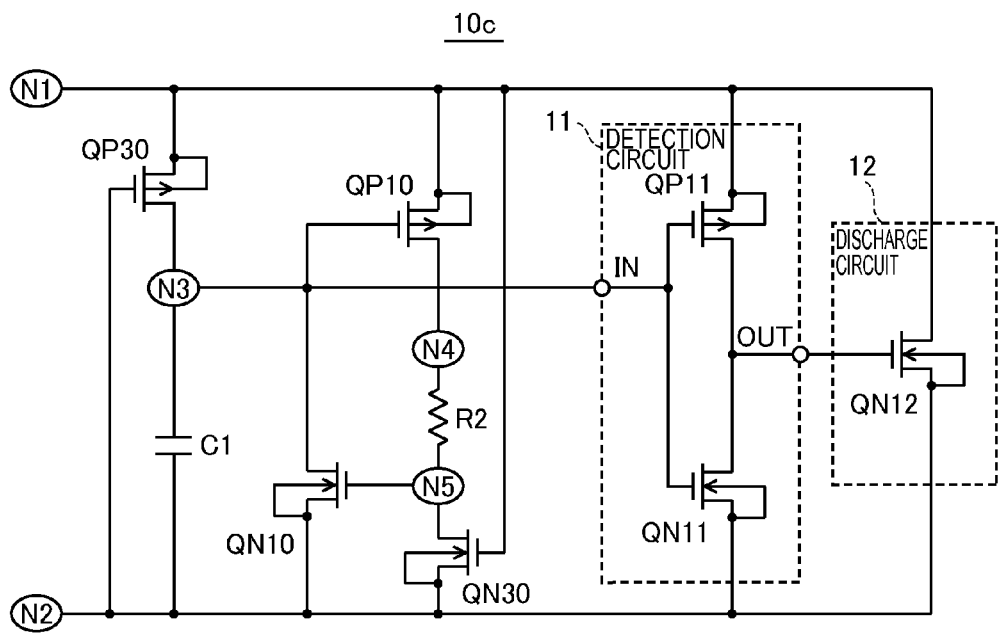
FIG. 9 is a circuit diagram showing an example of a configuration of an electrostatic protection circuit according to a fourth embodiment of the invention.

FIG. 9 is a circuit diagram showing an example of a configuration of an electrostatic protection circuit according to a fourth embodiment of the invention. In the first to third embodiments of the invention, a P-channel MOS transistor may be used as the first impedance element in place of the resistor element R1 (FIG. 3 and the like). Also, an N-channel MOS transistor may be used as the third impedance element in place of the resistor element R3 (FIG. 3 and the like).

FIG. 9 exemplarily shows an electrostatic protection circuit 10c realized by using a P-channel MOS transistor QP30 as the first impedance element and an N-channel MOS transistor QN30 as the third impedance element in the electrostatic protection circuit 10 according to the first embodiment shown in FIG. 3. In other regards, the electrostatic protection circuit 10c shown in FIG. 9 is similar to the electrostatic protection circuit 10 shown in FIG. 3.

The transistor QP30 has a source, a drain, and a gate that are connected to a node N1, a node N3, and a node N2, respectively. The transistor QP30 turns on when a positive voltage higher than a threshold voltage of the transistor QP30 is applied between the node N1 and the node N2.

On-resistance of the transistor QP30 depends on voltage between the node N1 and the node N2. When a discharge circuit 12 allows current to flow from the node N1 to the node N2, voltage between the node N1 and the node N2 decreases, but the on-resistance of the transistor QP30 increases. In this way, a reduction in voltage between the node N1 and the node N3 is suppressed. This makes it possible to prevent a transistor QP10 from turning off in the middle of a protection operation.

Also, with regard to variation in P-channel MOS transistors in manufacturing processes, a fluctuation in characteristics of the transistor QP10 and a fluctuation in characteristics of the transistor QP30 offset each other. This makes it possible to provide an electrostatic protection circuit with a small overall fluctuation in characteristics. Furthermore, by replacing a resistor element with a P-channel MOS transistor, the cost of a semiconductor integrated circuit apparatus can be reduced.

The transistor QN30 has a drain, a source, and a gate that are connected to a node N5, the node N2, and the node N1, respectively. The transistor QN30 turns on when a positive voltage higher than a threshold voltage of the transistor QN30 is applied between the node N1 and the node N2.

On-resistance of the transistor QN30 depends on voltage between the node N1 and the node N2. When the discharge circuit 12 allows current to flow from the node N1 to the node N2, voltage between the node N1 and the node N2 decreases, but the on-resistance of the transistor QN30 increases. In this way, a reduction in voltage between the node N5 and the node N2 is suppressed. This makes it possible to prevent a transistor QN10 from turning off in the middle of the protection operation.

Also, with regard to variation in N-channel MOS transistors in manufacturing processes, a fluctuation in characteristics of the transistor QN10 and a fluctuation in characteristics of the transistor QN30 offset each other. This makes it possible to provide an electrostatic protection circuit with a small overall fluctuation in characteristics. Furthermore, by replacing a resistor element with an N-channel MOS transistor, the cost of the semiconductor integrated circuit apparatus can be reduced.

Fifth Embodiment

Figure 10:
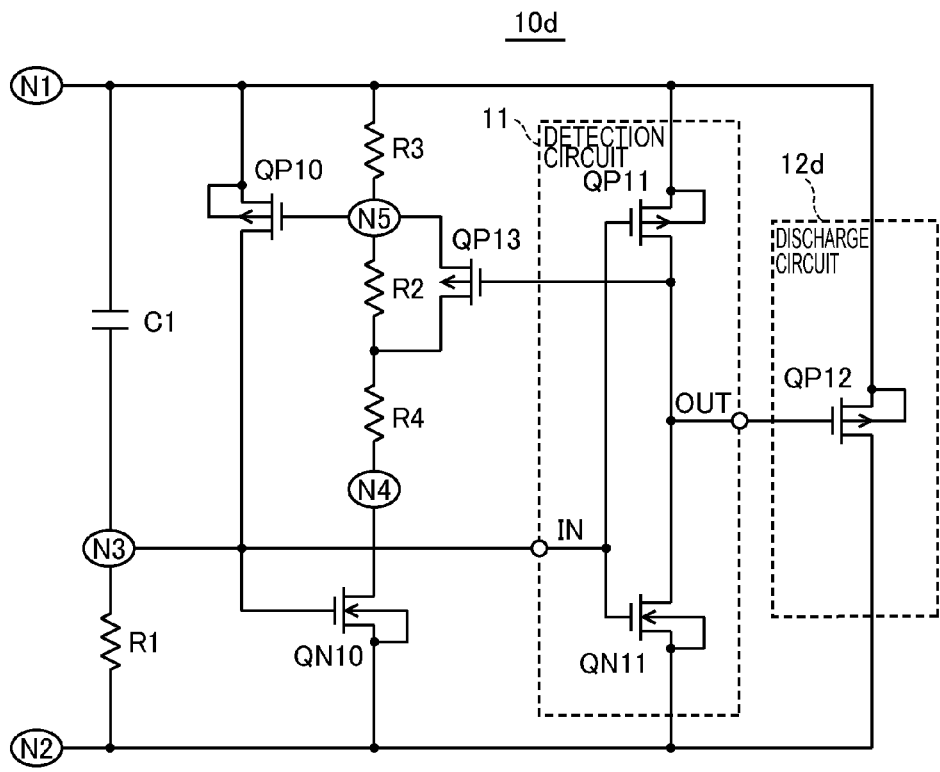
FIG. 10 is a circuit diagram showing an example of a configuration of an electrostatic protection circuit according to a fifth embodiment of the invention.

FIG. 10 is a circuit diagram showing an example of a configuration of an electrostatic protection circuit according to a fifth embodiment of the invention. In the first to third embodiments of the invention, an N-channel MOS transistor and a P-channel MOS transistor may be used as the first transistor and the second transistor, respectively, and connection among the elements may be changed accordingly.

FIG. 10 exemplarily shows an electrostatic protection circuit 10d realized by using an N-channel MOS transistor QN10 as the first transistor, a P-channel MOS transistor QP10 as the second transistor, and a P-channel MOS transistor QP13 as the third transistor in the electrostatic protection circuit 10a according to the second embodiment shown in FIG. 6.

The electrostatic protection circuit 10d includes a capacitor C1, resistor elements R1 to R3, the N-channel MOS transistor QN10, the P-channel MOS transistors QP10 and QP13, a detection circuit 11, and a discharge circuit 12d. The electrostatic protection circuit 10d may further include a resistor element R4.

A series circuit including the capacitor C1 and the resistor element R1, which are connected to each other by a node N3, is connected between a node N1 and a node N2. In the present embodiment, the capacitor C1 is connected between the node N1 and the node N3, and the resistor element R1 is connected between the node N3 and the node N2.

The transistor QN10 is connected between a node N4 and the node N2, and turns on in accordance with an increase in voltage generated in the resistor element R1. That is to say, the transistor QN10 has a drain, a source, and a gate that are connected to the node N4, the node N2, and the node N3, respectively, and turns on when voltage between the node N3 and the node N2 exceeds a threshold voltage.

The resistor elements R2 and R4 are connected between the node N4 and a node N5. The resistor element R3 is connected between the node N5 and the node N1. The transistor QP13 is connected in parallel to the resistor element R2. That is to say, the transistor QP13 has a source, a drain, and a gate that are connected to one end of the resistor element R2, the other end of the resistor element R2, and an output terminal OUT of the detection circuit 11. The resistor elements R2 to R4 and the transistor QP13 compose a voltage divider circuit that divides voltage between the node N1 and the node N4.

The transistor QP10 turns on in accordance with an increase in the voltage divided by the voltage divider circuit, and increases current that flows in the resistor element R1. That is to say, the transistor QP10 has a source, a drain, and a gate that are connected to the node N1, the node N3, and the node N5, respectively, and turns on when voltage between the node N1 and the node N5 exceeds a threshold voltage.

The detection circuit 11 activates an output signal upon detection of an on state of the transistor QP10. For example, the detection circuit 11 includes an inverter composed of a P-channel MOS transistor QP11 and an N-channel MOS transistor QN11. In this case, the detection circuit 11 activates the output signal to a low level when voltage generated in the resistor element R1 becomes higher than a predetermined percentage (e.g., 50%) of voltage between the node N1 and the node N2.

The discharge circuit 12d includes, for example, a P-channel MOS transistor QP12. The transistor QP12 has a source connected to the node N1, a drain connected to the node N2, and a gate to which the output signal of the detection circuit 11 is supplied. The discharge circuit 12d allows current to flow from the node N1 to the node N2 when the output signal of the detection circuit 11 is activated to a low level.

A description is now given of an operation of the electrostatic protection circuit 10d shown in FIG. 10.

When a positive voltage is applied between the node N1 and the node N2 (a potential of the node N1>a potential of the node N2), current flows from the node N1 to the node N2 via the capacitor C1 and the resistor element R1 in accordance with a time constant of the capacitor C1 and the resistor element R1, and the capacitor C1 is charged. As a result, a potential of the node N3 decreases relative to the potential of the node N1 in accordance with the time constant of the capacitor C1 and the resistor element R1.

When voltage applied between the node N1 and the node N2 increases moderately during a normal operation, voltage between the node N3 and the node N2 remains lower than a threshold voltage of the transistor QN10, and an off state of the transistor QN10 is maintained. On the other hand, when voltage applied between the node N1 and the node N2 increases steeply during a normal operation or due to electrostatic discharge, voltage between the node N3 and the node N2 becomes equal to or higher than the threshold voltage of the transistor QN10, and the transistor QN10 turns on. It should be noted that, at this point, a potential of an input terminal IN of the detection circuit 11 is of a low level.

As the transistor QN10 turns on, voltage is applied to the voltage divider circuit composed of the resistor elements R2 to R4 and the like, and voltage between the node N1 and the node N5 increases from 0 V. Here, when voltage between the node N1 and the node N2 is lower than a predetermined value, voltage between the node N1 and the node N5 remains lower than a threshold voltage of the transistor QP10, and an off state of the transistor QP10 is maintained. On the other hand, when voltage between the node N1 and the node N2 is equal to or higher than the predetermined value, voltage between the node N1 and the node N5 is equal to or higher than the threshold voltage of the transistor QP10, and the transistor QP10 turns on.

As the transistor QP10 turns on, current flowing in the resistor element R1 increases, and voltage between the node N3 and the node N2 increases. As a result, current flowing in the transistor QN10 increases (positive feedback). At the same time, a potential of the input terminal IN of the detection circuit 11 turns into a high level, and the output signal of the detection circuit 11 is activated to a low level. Consequently, the transistor QP12 of the discharge circuit 12d starts to allow current to flow from the node N1 to the node N2.

Once the output signal of the detection circuit 11 is activated to a low level and the electrostatic protection circuit 10d starts a protection operation, the transistor QP13 turns on, and a division ratio of the voltage divider circuit increases. As a result, voltage between the node N1 and the node N2 decreases, a margin for voltage that brings an internal circuit of a semiconductor integrated circuit apparatus to destruction increases, and an amount of tolerance for static electricity increases.

When voltage between the node N1 and the node N2 further decreases due to current flowing in the transistor QP12 of the discharge circuit 12d, voltage between the node N1 and the node N5 becomes lower than the threshold voltage of the transistor QP10. Accordingly, the transistor QP10 makes a transition from an on state to an off state. As a result, current flowing in the resistor element R1 decreases. Therefore, the output signal of the detection circuit 11 is deactivated to a high level, the transistor QP12 of the discharge circuit 12d makes a transition from an on state to an off state, and voltage between the node N1 and the node N2 is held substantially constant.

In the present embodiment, an N-channel MOS transistor may be used as the first impedance element in place of the resistor element R1. In this case, the N-channel MOS transistor has a drain, a source, and a gate that are connected to the node N3, the node N2, and the node N1, respectively.

On-resistance of this N-channel MOS transistor depends on voltage between the node N1 and the node N2. When the discharge circuit 12d allows current to flow from the node N1 to the node N2, voltage between the node N1 and the node N2 decreases, but the on-resistance of the N-channel MOS transistor increases. In this way, a reduction in voltage between the node N3 and the node N2 is suppressed. This makes it possible to prevent the transistor QN10 from turning off in the middle of the protection operation.

Also, a P-channel MOS transistor may be used as the third impedance element in place of the resistor element R3. In this case, the P-channel MOS transistor has a source, a drain, and a gate that are connected to the node N1, the node N5, and the node N2, respectively.

On-resistance of this P-channel MOS transistor depends on voltage between the node N1 and the node N2. When the discharge circuit 12d allows current to flow from the node N1 to the node N2, voltage between the node N1 and the node N2 decreases, but the on-resistance of the P-channel MOS transistor increases. In this way, a reduction in voltage between the node N1 and the node N5 is suppressed. This makes it possible to prevent the transistor QP10 from turning off in the middle of the protection operation.

Sixth Embodiment

Figure 11:
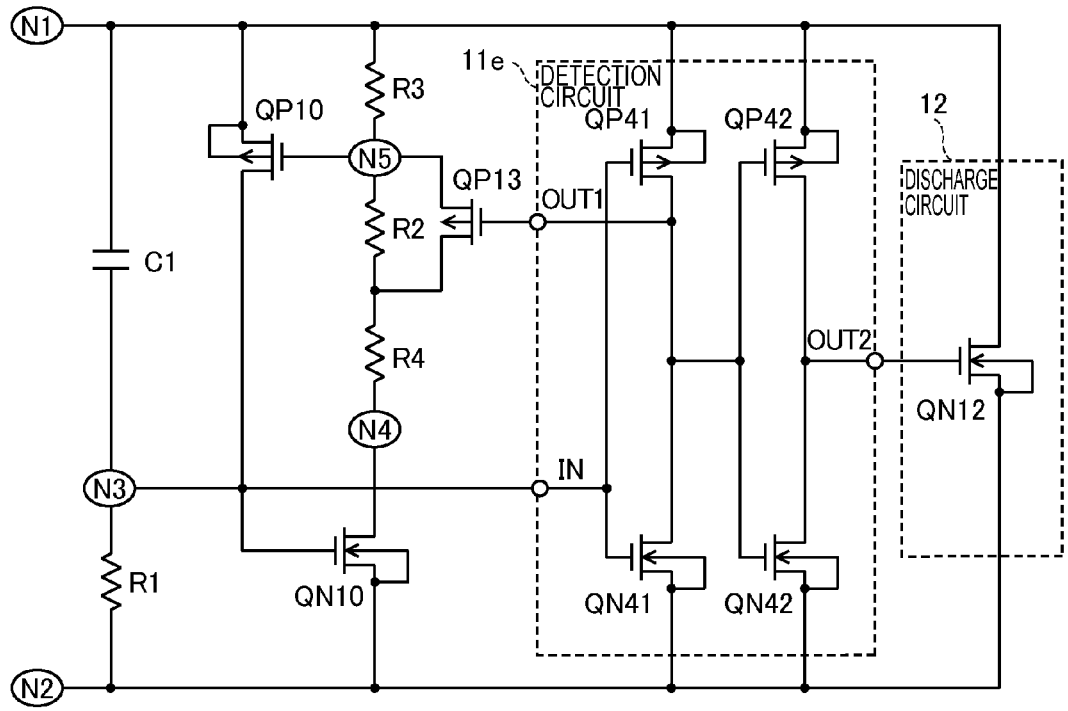
FIG. 11 is a circuit diagram showing an example of a configuration of an electrostatic protection circuit according to a sixth embodiment of the invention.

FIG. 11 is a circuit diagram showing an example of a configuration of an electrostatic protection circuit according to a sixth embodiment of the invention. In an electrostatic protection circuit 10e according to the sixth embodiment, a detection circuit 11e and a discharge circuit 12 are used respectively in place of the detection circuit 11 and the discharge circuit 12d according to the fifth embodiment shown in FIG. 10. In other regards, the electrostatic protection circuit 10e shown in FIG. 11 is similar to the electrostatic protection circuit 10d shown in FIG. 10.

The detection circuit 11e activates an output signal upon detection of an on state of a transistor QP10. For example, the detection circuit 11e includes a first inverter and a second inverter that are connected in series. The first inverter is composed of a P-channel MOS transistor QP41 and an N-channel MOS transistor QN41. The second inverter is composed of a P-channel MOS transistor QP42 and an N-channel MOS transistor QN42.

The first inverter detects whether a potential of a node N3 supplied to an input terminal IN is of a high level or a low level, inverts the level thereof, and outputs a first output signal of the inverted level from an output terminal OUT1. The second inverter detects whether the first output signal is of a high level or a low level, inverts the level thereof, and outputs a second output signal of the inverted level from an output terminal OUT2.

In this way, the detection circuit 11e activates the first output signal and the second output signal to a low level and a high level, respectively, when voltage generated in a resistor element R1 becomes higher than a predetermined percentage (e.g., 50%) of voltage between a node N1 and a node N2. The first output signal of the detection circuit 11e is supplied to a gate of a transistor QP13 of a voltage divider circuit. The second output signal of the detection circuit 11e is supplied to a gate of a transistor QN12 of the discharge circuit 12.

According to the present embodiment, an N-channel MOS transistor or an NPN bipolar transistor can be used in the discharge circuit 12. The N-channel MOS transistor or the NPN bipolar transistor can be formed on a P-type semiconductor substrate without an intervening well, and has excellent characteristics.

Examples of Impedance Elements

FIGS. 12A to 12H show examples of impedance elements that can be used other than resistor elements in the embodiments of the invention. In the embodiments of the invention, impedance elements shown in FIGS. 12A to 12H can be used in place of any of the resistor elements R2 and R4 to R6. It should be noted that, in FIGS. 12A to 12H, "N+" represents a node of a high-potential side, whereas "N−" represents a node of a low-potential side.

Figure 12:
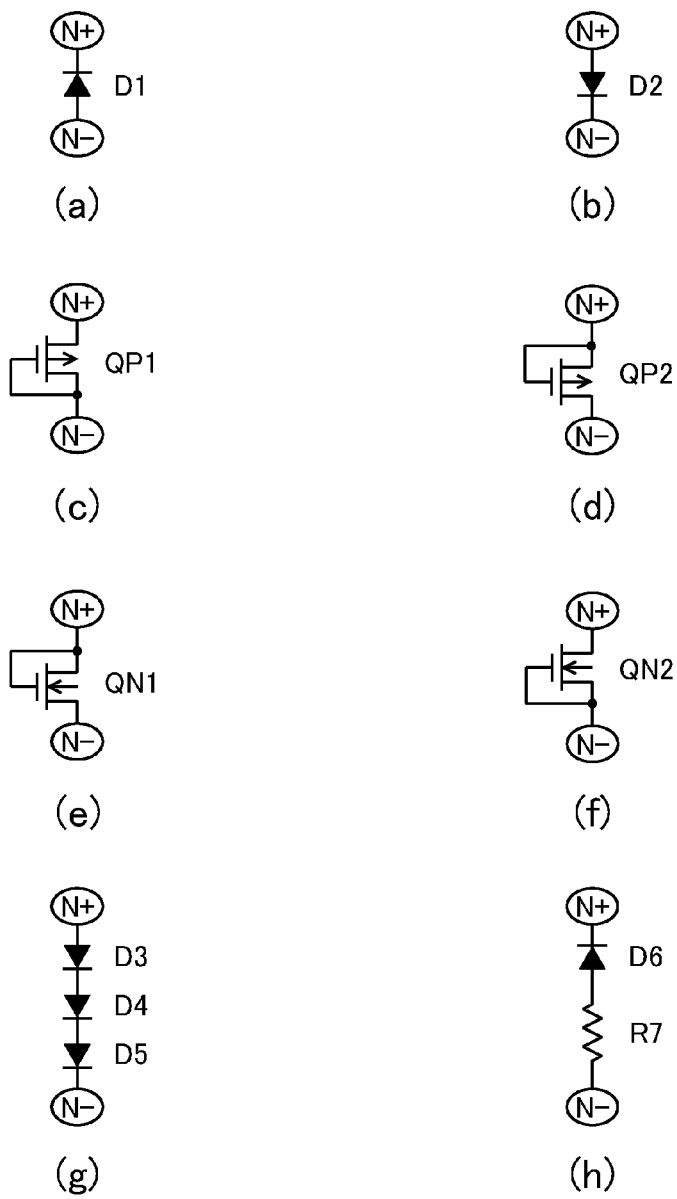
FIGS. 12A to 12H show examples of impedance elements that can be used other than resistor elements.

FIG. 12A shows a diode D1 that has a cathode and an anode connected respectively to a node N+ of a high-potential side and a node N− of a low-potential side. This diode D1 can be used in place of, for example, the resistor element R2 in the electrostatic protection circuit 10 according to the first embodiment shown in FIG. 3.

In FIG. 3, in a case where voltage applied between the node N1 and the node N2 increases steeply, the transistor QP10 turns on when voltage between the node N1 and the node N3 increases and becomes equal to or higher than the threshold voltage of the transistor QP10. If voltage applied from the transistor QP10 causes the diode D1 to break down, current flows in the resistor element R3, and voltage between the node N5 and the node N2 increases from 0 V.

When the diode D1 is used in place of the resistor element R2, the held voltage $V_H$ of the electrostatic protection circuit 10 is approximated by the following expression (7).

$$V_H \approx Vth_{QN10} + V_{BD1} \qquad (7)$$

Here, $Vth_{QN10}$ is the threshold voltage of the transistor QN10, and $V_{BD1}$ is a breakdown voltage of the diode D1.

In expression (3), variation in the held voltage $V_H$ is $(R_2+R_3)/R_3$ times the variation in the threshold voltage $Vth_{QN10}$ of the transistor QN10. On the other hand, variation in the breakdown voltage $V_{BD1}$ of the diode D1 is smaller than variation in the threshold voltage $Vth_{QN10}$ of the transistor QN10. Therefore, variation in the held voltage $V_H$ in expression (7) substantially depends on variation in the threshold voltage $Vth_{QN10}$ of the transistor QN10. This makes it possible to provide an electrostatic protection circuit with a small fluctuation in the held voltage $V_H$ relative to variation in the threshold voltage $Vth_{QN10}$ of the transistor QN10.

FIG. 12B shows a diode D2 that has an anode and a cathode connected respectively to a node N+ of a high-potential side and a node N− of a low-potential side. This diode D2 can be used in place of, for example, the resistor element R2 in the electrostatic protection circuit 10 according to the first embodiment shown in FIG. 3.

In FIG. 3, in a case where voltage applied between the node N1 and the node N2 increases steeply, the transistor QP10 turns on when voltage between the node N1 and the node N3 increases and becomes equal to or higher than the threshold voltage of the transistor QP10. When a forward current flows in the diode D2 due to voltage applied from the transistor QP10, current flows also in the resistor element R3, and voltage between the node N5 and the node N2 increases from 0 V.

When the diode D2 is used in place of the resistor element R2, the held voltage $V_H$ of the electrostatic protection circuit 10 is approximated by the following expression (8).

$$V_H \approx Vth_{QN10} + V_{FD2} \qquad (8)$$

Here, $Vth_{QN10}$ is the threshold voltage of the transistor QN10, and $V_{FD2}$ is a forward voltage of the diode D2.

In expression (3), variation in the held voltage $V_H$ is $(R_2+R_3)/R_3$ times the variation in the threshold voltage $Vth_{QN10}$ of the transistor QN10. On the other hand, variation in the held voltage $V_H$ in expression (8) is a sum of variation in the threshold voltage $Vth_{QN10}$ of the transistor QN10 and variation in the forward voltage $V_{FD2}$ of the diode D2. Variation in the forward voltage $V_{FD2}$ of the diode D2 associated with mass production is small. This makes it possible to provide an electrostatic protection circuit with a small fluctuation in the held voltage $V_H$ relative to variation in the threshold voltage $Vth_{QN10}$ of the transistor QN10. Also, as the forward voltage $V_{FD2}$ of the diode D2 is relatively low, it is possible to set a low held voltage $V_H$.

FIG. 12C shows a P-channel MOS transistor QP1 that has a source connected to a node N+ of a high-potential side, as well as a drain and a gate connected to a node N− of a low-potential side. This transistor QP1 can be used in place of, for example, the resistor element R2 in the electrostatic protection circuit 10 according to the first embodiment shown in FIG. 3.

In FIG. 3, in a case where voltage applied between the node N1 and the node N2 increases steeply, the transistor QP10 turns on when voltage between the node N1 and the node N3 increases and becomes equal to or higher than the threshold voltage of the transistor QP10. When current flows in the transistor QP1 due to voltage applied from the transistor QP10, current flows also in the resistor element R3, and voltage between the node N5 and the node N2 increases from 0 V. Here, as the gate of the transistor QP1 is connected to the drain, the transistor QP1 operates in a saturated region. Therefore, in a range where a drain current is sufficiently small, a source-drain voltage of the transistor QP1 is substantially equal to a threshold voltage $Vth_{QP1}$.

When the transistor QP1 is used in place of the resistor element R2, the held voltage $V_H$ of the electrostatic protection circuit 10 is approximated by the following expression (9).

$$V_H \approx Vth_{QN10} + Vth_{QP1} \qquad (9)$$

Here, $Vth_{QN10}$ is the threshold voltage of the transistor QN10, and $Vth_{QP1}$ is the threshold voltage of the transistor QP1.

In expression (3), variation in the held voltage $V_H$ is $(R_2+R_3)/R_3$ times the variation in the threshold voltage $Vth_{QN10}$ of the transistor QN10. On the other hand, variation in the held voltage $V_H$ in expression (9) is a sum of variation in the threshold voltage $Vth_{QN10}$ of the transistor QN10 and variation in the threshold voltage $Vth_{QP1}$ of the transistor QP1. This makes it possible to provide an electrostatic protection circuit with a small fluctuation in the held voltage $V_H$ with respect to variation in the threshold voltage $Vth_{QN10}$ of the transistor QN10. Also, as the threshold voltage $Vth_{QP1}$ of the transistor QP1 is relatively low, it is possible to set a low held voltage $V_H$.

FIG. 12D shows a P-channel MOS transistor QP2 that has a source and a gate connected to a node N+ of a high-potential side, as well as a drain connected to a node N− of a low-potential side. This transistor QP2 can be used in place of, for example, the resistor element R2 in the electrostatic protection circuit 10 according to the first embodiment shown in FIG. 3.

In FIG. 3, in a case where voltage applied between the node N1 and the node N2 increases steeply, the transistor QP10 turns on when voltage between the node N1 and the node N3 increases and becomes equal to or higher than the threshold voltage of the transistor QP10. If voltage applied from the transistor QP10 causes the transistor QP2 to break down, current flows in the resistor element R3, and voltage between the node N5 and the node N2 increases from 0 V.

When the transistor QP2 is used in place of the resistor element R2, the held voltage $V_H$ of the electrostatic protection circuit 10 is approximated by the following expression (10).

$$V_H \approx Vth_{QN10} + V_{BQP2} \qquad (10)$$

Here, $Vth_{QN10}$ is the threshold voltage of the transistor QN10, and $V_{BQP2}$ is a breakdown voltage of the transistor QP2.

In expression (3), variation in the held voltage $V_H$ is $(R_2+R_3)/R_3$ times the variation in the threshold voltage $Vth_{QN10}$ of the transistor QN10. On the other hand, variation in the held voltage $V_H$ in expression (10) is a sum of variation in the threshold voltage $Vth_{QN10}$ of the transistor QN10 and variation in the breakdown voltage $V_{BQP2}$ of the transistor QP2. This makes it possible to provide an electrostatic protection circuit with a small fluctuation in the held voltage $V_H$ with respect to variation in the threshold voltage $Vth_{QN10}$ of the transistor QN10.

FIG. 12E shows an N-channel MOS transistor QN1 that has a drain and a gate connected to a node N+ of a high-potential side, as well as a source connected to a node N− of a low-potential side. This transistor QN1 can be used in place of, for example, the resistor element R2 in the electrostatic protection circuit 10 according to the first embodiment shown in FIG. 3.

In FIG. 3, in a case where voltage applied between the node N1 and the node N2 increases steeply, the transistor QP10 turns on when voltage between the node N1 and the node N3 increases and becomes equal to or higher than the threshold voltage of the transistor QP10. When current flows in the transistor QN1 due to voltage applied from the transistor QP10, current flows also in the resistor element R3, and voltage between the node N5 and the node N2 increases from 0 V. Here, as the gate of the transistor QN1 is connected to the drain, the transistor QN1 operates in a saturated region. Therefore, in a range where a drain current is sufficiently small, a drain-source voltage of the transistor QN1 is substantially equal to a threshold voltage $Vth_{QN1}$.

When the transistor QN1 is used in place of the resistor element R2, the held voltage $V_H$ of the electrostatic protection circuit 10 is approximated by the following expression (11).

$$V_H \approx Vth_{QN10} + Vth_{QN1} \qquad (11)$$

Here, $Vth_{QN10}$ is the threshold voltage of the transistor QN10, and $Vth_{QN1}$ is the threshold voltage of the transistor QN1.

In expression (3), variation in the held voltage $V_H$ is $(R_2+R_3)/R_3$ times the variation in the threshold voltage $Vth_{QN10}$ of the transistor QN10. On the other hand, variation in the held voltage $V_H$ in expression (11) is a sum of variation in the threshold voltage $Vth_{QN10}$ of the transistor QN10 and variation in the threshold voltage $Vth_{QN1}$ of the transistor QN1. This makes it possible to provide an electrostatic protection circuit with a small fluctuation in the held voltage $V_H$ with respect to variation in the threshold voltage $Vth_{QN10}$ of the transistor QN10. Also, as the threshold voltage $Vth_{QN1}$ of the transistor QN1 is relatively small, it is possible to set a low held voltage $V_H$.

FIG. 12F shows an N-channel MOS transistor QN2 that has a drain connected to a node N+ of a high-potential side, as well as a source and a gate connected to a node N− of a low-potential side. This transistor QN2 can be used in place of, for example, the resistor element R2 in the electrostatic protection circuit 10 according to the first embodiment shown in FIG. 3.

In FIG. 3, in a case where voltage applied between the node N1 and the node N2 increases steeply, the transistor QP10 turns on when voltage between the node N1 and the node N3 increases and becomes equal to or higher than the threshold voltage of the transistor QP10. If voltage applied from the transistor QP10 causes the transistor QN2 to break down, current flows in the resistor element R3, and voltage between the node N5 and the node N2 increases from 0 V.

When the transistor QN2 is used in place of the resistor element R2, the held voltage $V_H$ of the electrostatic protection circuit 10 is approximated by the following expression (12).

$$V_H \approx Vth_{QN10} + V_{BQN2} \qquad (12)$$

Here, $Vth_{QN10}$ is the threshold voltage of the transistor QN10, and $V_{BQN2}$ is a breakdown voltage of the transistor QN2.

In expression (3), variation in the held voltage $V_H$ is $(R_2+R_3)/R_3$ times the variation in the threshold voltage $Vth_{QN10}$ of the transistor QN10. On the other hand, variation in the held voltage $V_H$ in expression (12) is a sum of variation in the threshold voltage $Vth_{QN10}$ of the transistor QN10 and variation in the breakdown voltage $V_{BQN2}$ of the transistor QN2. This makes it possible to provide an electrostatic protection circuit with a small fluctuation in the held voltage $V_H$ with respect to variation in the threshold voltage $Vth_{QN10}$ of the transistor QN10.

FIG. 12G shows an example in which an impedance element includes a plurality of the same devices. This impedance element includes three diodes D3 to D5 connected in series. An anode of the diode D3 is connected to a node N+ of a high-potential side, and a cathode of the diode D5 is connected to a node N− of a low-potential side. These diodes D3 to D5 can be used in place of, for example, the resistor element R2 in the electrostatic protection circuit 10 according to the first embodiment shown in FIG. 3.

In FIG. 3, in a case where voltage applied between the node N1 and the node N2 increases steeply, the transistor QP10 turns on when voltage between the node N1 and the node N3 increases and becomes equal to or higher than the threshold voltage of the transistor QP10. When a forward current flows in the diodes D3 to D5 due to voltage applied from the transistor QP10, current flows also in the resistor element R3, and voltage between the node N5 and the node N2 increases from 0 V.

When the diodes D3 to D5 are used in place of the resistor element R2, the held voltage $V_H$ of the electrostatic protection circuit 10 is approximated by the following expression (13).

$$V_H \approx Vth_{QN10} + V_{FD3} + V_{FD4} + V_{FD5}, \quad (13)$$

where $Vth_{QN10}$ is the threshold voltage of the transistor QN10, $V_{FD3}$ is a forward voltage of the diode D3, $V_{FD4}$ is a forward voltage of the diode D4, and $V_{FD5}$ is a forward voltage of the diode D5. As indicated by expression (13), the held voltage $V_H$ of the electrostatic protection circuit 10 can be set freely depending on the number of diodes connected in series. Also, variation in the forward voltage $V_{FD2}$ of the diode D2 associated with mass production is small. This makes it possible to provide an electrostatic protection circuit with a small fluctuation in the held voltage $V_H$ with respect to variation in the threshold voltage $Vth_{QN10}$ of the transistor QN10.

FIG. 12H shows an example in which an impedance element includes a plurality of different devices. This impedance element includes a diode D6 and a resistor element R7 connected in series. A cathode of the diode D6 is connected to a node N+ of a high-potential side, and one end of the resistor element R7 is connected to a node N− of a low-potential side. These diode D6 and resistor element R7 can be used in place of, for example, the resistor element R2 in the electrostatic protection circuit 10 according to the first embodiment shown in FIG. 3.

In FIG. 3, in a case where voltage applied between the node N1 and the node N2 increases steeply, the transistor QP10 turns on when voltage between the node N1 and the node N3 increases and becomes equal to or higher than the threshold voltage of the transistor QP10. If voltage applied from the transistor QP10 causes the diode D6 to break down, current flows in the resistor elements R7 and R3, and voltage between the node N5 and the node N2 increases from 0 V.

When the diode D6 and the resistor element R7 are used in place of the resistor element R2, the held voltage $V_H$ of the electrostatic protection circuit 10 is approximated by the following expression (14).

$$V_H \approx Vth_{QN10}(R_3+R_7)/R_N + V_{BD6}, \quad (14)$$

where $Vth_{QN10}$ is the threshold voltage of the transistor QN10, $R_3$ is a resistance value of the resistor element R3, $R_7$ is a resistance value of the resistor element R7, and $V_{BD6}$ is a breakdown voltage of the diode D6. As indicated by expression (14), a desired held voltage $V_H$ can be set by selecting the resistance values of the resistor elements R3 and R7. Also, variation in the breakdown voltage $V_{BD6}$ of the diode D6 is smaller than variation in the threshold voltage $Vth_{QN10}$ of the transistor QN10. This makes it possible to provide an electrostatic protection circuit with a small fluctuation in the held voltage $V_H$ compared to a case in which only a resistor element is used.

As described above, an appropriate device is selected or a plurality of devices are combined from among resistor elements, diodes, and transistors. This makes it possible to freely set an end-to-end voltage of an electrostatic protection circuit, and to provide an electrostatic protection circuit that is not easily influenced by process variation.

Examples of Discharge Circuits

Other than a MOS transistor (a metal-oxide-semiconductor field-effect transistor (FET)), for example, a three-terminal element and a circuit that have a function of allowing current to flow and have terminals for controlling on/off of the current can be used in the discharge circuit of the electrostatic protection circuit according to the embodiments of the invention.

Examples of the three-terminal element include a junction FET, a metal-semiconductor FET, a bipolar transistor, and a thyristor. These three-terminal elements can be used not only as a discharge circuit, but also in place of other MOS transistors.

Figure 13:
FIGS. 13A and 13B show examples of three-terminal elements that can be used other than MOS transistors.

FIGS. 13A and 13B show examples of three-terminal elements that can be used other than MOS transistors in a discharge circuit. It should be noted that, in FIGS. 13A and 13B, "NS" represents a node to which an output signal of a detection circuit is supplied.

In the first to fourth embodiments and the sixth embodiment of the invention, an NPN bipolar transistor shown in FIG. 13A can be used in place of the N-channel MOS transistor QN12 of the discharge circuit 12. This NPN bipolar transistor has a collector, an emitter, and a base that are connected to the node N1, the node N2, and the node NS, respectively.

In the fifth embodiment of the invention, a PNP bipolar transistor shown in FIG. 13B can be used in place of the P-channel MOS transistor QP12 of the discharge circuit 12d. This PNP bipolar transistor has an emitter, a collector, and a base that are connected to the node N1, the node N2, and the node NS, respectively.

The embodiments described above are not intended to limit the invention. Many modifications can be made by a person of ordinary skill in the art within technical ideas of the invention.

This application claims priority from Japanese Patent Application No. 2013-253930 filed in the Japanese Patent Office on Dec. 9, 2013, the entire disclosure of which is hereby incorporated by reference in its entirely.

What is claimed is:

1. An electrostatic protection circuit that is connected via a first node to a first terminal to which a first potential is supplied, and is connected via a second node to a second terminal to which a second potential lower than the first potential is supplied, the electrostatic protection circuit comprising:

a first impedance element, one end thereof being connected to one of the first node and the second node, and the other end thereof being connected to a third node;

a capacitor, one end thereof being connected to the third node, and the other end thereof being connected to the other of the first node and the second node;

a first transistor that is connected between the one of the first node and the second node and a fourth node, and is placed in an electrically conductive state in accordance with an increase in voltage generated at both ends of the first impedance element;

a voltage divider circuit that includes a second impedance element and a third impedance element and divides voltage between the other of the first node and the second node and the fourth node, the second impedance element being connected between the fourth node and a fifth node, and the third impedance element being connected between the other of the first node and the second node and the fifth node;

a second transistor that is placed in an electrically conductive state in accordance with an increase in voltage generated at both ends of the third impedance element;

a detection circuit that activates an output signal upon detection of the electrically conductive state of the second transistor; and a discharge circuit that is connected between the first node and the second node, and allows current to flow from the first node to the second node when the output signal of the detection circuit is activated.

2. The electrostatic protection circuit according to claim 1, wherein
the voltage divider circuit further includes a third transistor connected in parallel to the second impedance element, the third transistor turning on when the output signal of the detection circuit is activated.

3. The electrostatic protection circuit according to claim 1, wherein
the voltage divider circuit includes a plurality of impedance elements and at least one transistor, the plurality of impedance elements being connected in series between the fourth node and the fifth node, and the at least one transistor being connected in parallel to at least one of the plurality of impedance elements and turning on when the output signal of the detection circuit is activated.

4. The electrostatic protection circuit according to claim 1, wherein
the second impedance element or each of a plurality of impedance elements includes at least one of a resistor element, a diode, and a P-channel transistor or an N-channel transistor in which a gate is connected to a drain or a source.

5. The electrostatic protection circuit according to claim 1, wherein
the first impedance element includes one of a resistor element and a P-channel transistor, the resistor element being connected between the first node and the third node, and the P-channel transistor having a source, a drain, and a gate connected to the first node, the third node, and the second node, respectively, and
the third impedance element includes one of a resistor element and an N-channel transistor, the resistor element being connected between the fifth node and the second node, and the N-channel transistor having a drain, a source, and a gate connected to the fifth node, the second node, and the first node, respectively.

6. The electrostatic protection circuit according to claim 5, wherein
the first transistor includes a P-channel transistor having a source, a drain, and a gate connected to the first node, the fourth node, and the third node, respectively, and voltage is applied to the voltage divider circuit by the P-channel transistor turning on in accordance with an increase in voltage between the first node and the third node.

7. The electrostatic protection circuit according to claim 5, wherein
the second transistor includes an N-channel transistor having a drain, a source, and a gate connected to the third node, the second node, and the fifth node, respectively, and the output signal of the detection circuit is activated by the N-channel transistor turning on in accordance with an increase in voltage between the fifth node and the second node.

8. The electrostatic protection circuit according to claim 1, wherein
the detection circuit includes an inverter having an input terminal to which a potential of the third node is supplied, and activates the output signal when voltage generated in the first impedance element becomes higher than a predetermined percentage of voltage between the first node and the second node.

9. The electrostatic protection circuit according to claim 1, wherein
the discharge circuit includes one of an N-channel transistor and an NPN transistor, the N-channel transistor having a drain connected to the first node, a source connected to the second node, and a gate to which the output signal of the detection circuit is supplied, and the NPN transistor having a collector connected to the first node, an emitter connected to the second node, and a base to which the output signal of the detection circuit is supplied.

10. A semiconductor integrated circuit apparatus comprising the electrostatic protection circuit according to claim 1.

11. A semiconductor integrated circuit apparatus comprising the electrostatic protection circuit according to claim 2.

12. A semiconductor integrated circuit apparatus comprising the electrostatic protection circuit according to claim 3.

13. A semiconductor integrated circuit apparatus comprising the electrostatic protection circuit according to claim 4.

14. A semiconductor integrated circuit apparatus comprising the electrostatic protection circuit according to claim 5.

15. A semiconductor integrated circuit apparatus comprising the electrostatic protection circuit according to claim 6.

16. A semiconductor integrated circuit apparatus comprising the electrostatic protection circuit according to claim 7.

17. A semiconductor integrated circuit apparatus comprising the electrostatic protection circuit according to claim 8.

18. A semiconductor integrated circuit apparatus comprising the electrostatic protection circuit according to claim 9.

* * * * *